Dec. 13, 1966 L. J. SCIAMBI 3,291,738

MATERIALS FOR PREPARING ETCH RESISTS

Original Filed Sept. 2, 1960

INVENTOR.
LOUIS J. SCIAMBI
BY
ATTORNEY 3,291,738
Patented Dec. 13, 1966

1

3,291,738

MATERIALS FOR PREPARING ETCH RESISTS

Louis J. Sciambi, Woodbury, N.J., assignor to Radio Corporation of America, a corporation of Delaware Original application Sept. 2, 1960, Ser. No. 53,706, now Patent No. 3,231,374, dated Jan. 25, 1966. Divided and this application Dec. 13, 1961, Ser. No. 159,177
10 Claims. (Cl. 252—62.1)

This invention relates to improved materials for curing or hardening resin coatings by promoting cross-linking of molecular chains in the resin, such materials being particularly adapted for preparing etched plates such as, for example, printing plates and printed circuit boards. This is a division of my copending application Serial No. 53,706, filed September 2, 1960, now U.S. Patent No. 3,231,374.

It is often desirable to cure or harden resinous coatings on a suitable substrate such as, for example, a metal plate. Such curing is often accomplished either to render the coating more durable or to enhance the adherence of the coating to the substrate, or both. Curable coatings are often applied to the substrate from solvent solutions which include a cross-linking or drying catalyst for the resin which is dissolved in the solvent. The solution is coated on a plate and the coating dried thereon by evaporation of the solvent. Curing is subsequently accomplished by heating the plate to a critical temperature whereupon the catalyst promotes cross-linking between molecular chains in the resin. One disadvantage of such a method is that a resin coating, which includes a catalyst, can become cured accidentally if exposed to heat or sometimes through ageing. Many such coatings, once cured, are substantially insoluble and are difficult to remove. It is sometimes desirable to harden or cure specified areas of a coating. To do so with conventional coatings is difficult since only the specified areas on the coating must be brought to the critical temperature while maintaining the other areas thereof below that temperature.

A more specific application of cured coatings occurs in the preparation of etched plates. In conventional photoetching processes, the object to be etched, usually a metal plate or metal clad substrate, is coated with a photoresist. The photoresist is then exposed to an ultraviolet light image, usually by a contact exposure, until the exposed photoresist is rendered insoluble or "hardened" in the exposed areas. The unexposed photoresist is washed away and the object etched to the desired depth.

Conventional photoresists generally require relatively long exposures to the ultraviolet light image because of the relative insensitivity of available photoresists. Consequently, it becomes a practical necessity to first prepare a permanent, relatively dense, full size transparency of the subject matter to be etched. The transparency must then be held firmly against the photoresist during the relatively long, intense exposure to ultraviolet light to obtain the necessary hardening of the photoresist with a minimum loss in resolution. To accomplish this, photoetches resort to special vacuum frames for holding the transparency in place and to intense ultraviolet light sources for exposure. Even so, exposure times of ten minutes or more are common.

An object is to provide improved materials for preparing etch resists.

Another object is to provide improved materials for producing etched plates with electrostatic printing techniques.

A still further object is to provide improved materials for preparing etched plates wherein the use of a photoresist is eliminated.

Yet another object is to provide improved electrophotographic materials for producing etched printing plates.

2

In general, the foregoing and other objects and advantages are accomplished in accordance with the invention by providing a substrate having a coating thereon which comprises a substantial proportion of a normally soluble resin which has molecular chains capable of being cross-linked. A powder, comprising a material which is compatible with the coating and is a catalyst for promoting the cross-linking of the molecular chains of the resin at an elevated temperature, is distributed over the coating. The powder may cover the entire surface but is usually distributed thereover in a definite configuration as by stenciling. Preferably, the coating surface is provided with an electrostatic charge in a design configuration, the powder being electrostatically attracted to and held by the electrostatic charges on the surface. The coating, with the powder thereon is then heated to an elevated temperature, such as, for example, 300 to 400° F. to produce cross-linking in the resin under the powder. Coating material cured in this manner exhibits enhanced durability and resistance to solvents and acids.

A preferred method of this invention encompasses providing a plate to be etched with a photoconductive insulating coating such as, for example, one comprising a finely-divided photoconductor dispersed in a binder at least a substantial proportion of which is a normally soluble resin which has molecular chains capable of being cross-linked. An electrostatic image is electrophotographically produced on the coating and is then developed into a powder image with a catalytic developer powder. The image bearing plate is then heated to a temperature sufficient to cause cross-linking in the resin under the catalytic powder. When so heated, the binder in the image areas on the plate is converted into an etch resist. The remaining soluble binder and the photoconductor, in non-image areas, is removed with a solvent in which the cross-linked coating is insoluble. The plate can now be etched to the desired depth, the hardened areas of the coating providing a resist to the etch solution. A suitable cross-linking resin comprises a resinous polysiloxane.

The invention also includes novel developer compositions for use in the above methods. Such compositions comprise catalytic particles such as, for example, metal octoates or stearates, and a carrier material such as, for example, insulating liquids.

In contrast to known methods of curing resin coatings, wherein the curing catalyst is included in the coating, the methods and materials of this invention obviate the risk of accidental curing by exposure to heat or through ageing. Since, as described herein, catalytic material is only brought into contact with the coating at the time when curing thereof is desired, the risk of accidental curing is avoided. Since the catalytic material can be easily applied to specified areas on the coating to limit curing to the resin in those areas, the risk of curing resin in unwanted areas is substantially eliminated.

Specific examples and additional advantages of the improved methods of curing resinous polymers and of the improved developer compositions for use in such methods are included in the following detailed description which refers to the accompanying drawings wherein.

Similar reference characters are applied to similar elements throughout the drawings.

COATINGS

Figures 1, 2, 3, 4, 5, 6, 7:
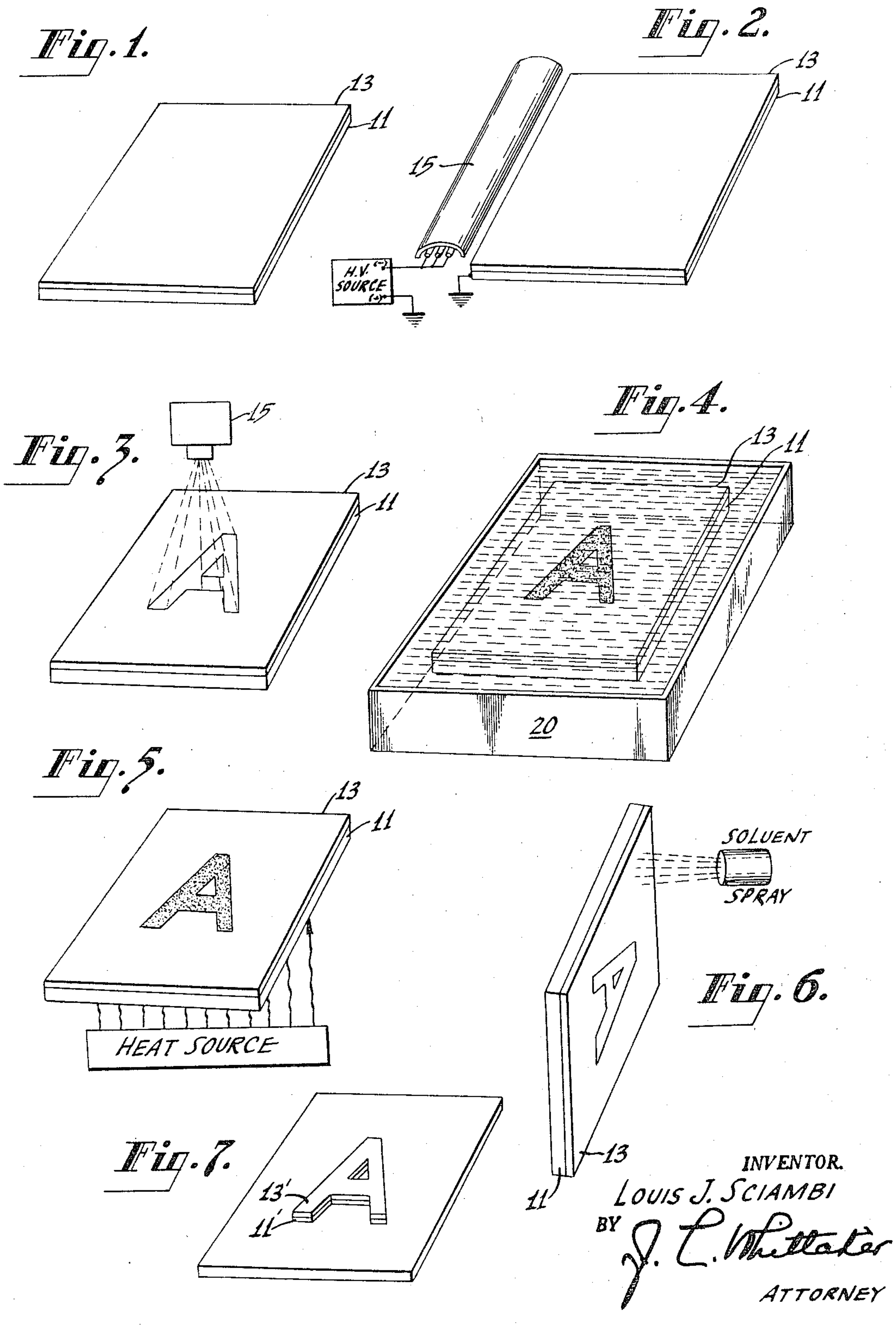
FIG. 1 is a perspective view of a substrate or plate having a coating thereon at least a substantially proportion of which comprises an uncured resin.
FIGS. 2 to 6 are perspective views illustrating successive steps of a preferred method for preparing etched plates in accordance with the present invention.

Normally soluble resins capable of being insolubilized by cross-linking have been extensively employed as coatings for various substrates. One class of such resins includes, for example, resinous polysiloxanes or silicone resins. Generally such resins are dissolved in a suitable solvent such as, for example, toluene or xylene. The resin solvent solution is then applied to a substrate such as a metal plate and the solvent evaporated therefrom to provide an adherent coating on the substrate. In an uncured state, such a coating may be destroyed or damaged by many hydrocarbon fluids, acids or alkalis or by mechanical abrasion. Curing of a resinous coating enhances its durability and renders it insoluble to most fluids. Under some circumstances, curing may be accomplished with heat alone. However, for optimum results, catalytic curing is preferred and, under some circumstances, necessary. Known methods of promoting cross-linking or curing of silicone resins are described in greater detail in An Introduction to the Chemistry of the Silicones, second edition, by Eugene G. Rochow, published by John Wiley and Sons, Inc., New York, New York. Briefly such methods comprise preparing a solvent solution of the silicone resin plus a small amount of a catalyst. The substrate is coated with the solution and the solvent thereof evaporated from the coating. The coated substrate is then heated at a curing temperature for a time sufficient for the catalyst to promote cross-linking of the molecular chains in the resin.

In addition to the aforesaid silicone resins, other suitable coating resins include: vinyl resins, phenolformaldehyde resins, polystyrenes, alkyd resins, amino resins, high styrenebutadiene resins and compatible mixtures thereof. Such resins, although capable of being dried or cured in air or with heat, are preferably cured with heat and a catalyst. Coating resins and catalysts therefor are more fully described in Organic Coating Technology, vol. 1, by Payne, Wiley and Sons, Inc., New York, N.Y.

In FIG. 1, there is shown a substrate or plate 11 having a coating 13 thereon comprising, for example, an uncured resinous polysiloxane. Coating solutions which can be employed to produce the coating 13 are readily available on the open market. One such solution is designated as G.E. SR–82 and comprises a solution of silicone resin in xylene. This solution is marketed by the General Electric Co., Silicone Products Division, Waterford, New York. Any standard coating technique may be employed, and, once the coated plate is dried, it is ready for further processing.

In accordance with this invention a catalytic powder such as, for example, aluminum octoate, aluminum stearate, or a mixture of the two is distributed over the surface of the coating 13, after which the coated substrate is heated to a temperatue sufficient to cause cross-linking of molecular chains in the polysiloxane coating 13. A temperature of from about 300 to 400° F. is generally sufficient when maintained for 1 minute up to about 15 minutes.

In addition to aluminum octoate or aluminum stearate, there are many other suitable catalysts for promoting cross-linking of molecular chains in resinous polysiloxanes. Suitable powders may be selected from metal-organic compounds, metal organic salts etc. For example, a catalytic powder can be selected from the linoleates, naphthenates, octoates, resinates, stearates, and tallates of aluminum, cadmium, cobalt, copper, iron, lead, magnesium, manganese or zinc. An aluminum octoate powder may be readily removed from the cured coating 13 with a jet of air or by rushing. When aluminum stearate is employed, it becomes fused to the coating 13 during the curing process and, hence, becomes an integral part of the cured coating. Among the many catalysts which are useful in this invention a preferred list thereof, in addition to the aluminum octoate and aluminum stearate mentioned heretofore, includes: iron distearate, copper stearate, lead stearate, zinc stearate, magnesium stearate, zinc octoate, and lead octoate. All of these catalysts are readily available in powdered form.

In FIGS. 2 to 7 there is depicted a preferred method of preparing etched plates in accordance with this invention. In this method the plate 11 of FIG. 1 is provided with a photoconducting insulating coating 13 thereon. The coating comprises, for example, a binder of resinous polysiloxane in which there is dispersed a finely-divided photoconductor such as a photoconductive zinc oxide.

A uniform electrostatic charge is distributed over the surface of the photoconductive coating 13 as depicted in FIG. 2. With the plate 11 grounded, a corona discharge unit 15 is passed over the photoconductive coating 13. Three or four passes of the discharge unit 13 are usually sufficient to provide an intense uniform electrostatic charge on the coating 13.

In the next step, as shown in FIG. 3, the charged coating 13 is exposed to a light image as, for example, by exposure from a projector 15. Whereever light impinges upon the photoconductive coating 13, the change thereon is dissipated producing an electrostatic image on the coating 13 which corresponds to the dark areas of the light image.

In FIG. 4, a developer tray 20 contains a liquid carrier comprising a low-viscosity insulating fluid such as, for example, a dimethyl-polysiloxane. One of the aforementioned catalytic powders such as, for example, aluminum octoate and/or aluminum stearate is dispersed in the liquid carrier. When an electrostatic image bearing plate is immersed in the tray, the catalytic power is electrostatically attracted to the image and electrostatically adheres thereto. Other methods for applying liquid developer dispersions included spraying, flowing, and rolling the dispersion over the electrostatic image.

Preferred developer dispersions can be provided by dispersing catalytic powder particles in either of the following carrier liquids: (1) a carrier liquid comprised of a dimethlypolysiloxane having a viscosity of 0.6 to 0.3 centistoke and trichlorotrifluoroethane, or (2) a carrier liquid comprised of a straight chain hydrocarbon having 5 to 8 carbon atoms (or an isomer thereof) and a low-viscosity mineral oil. The following examples illustrate two such dispesrions:

*Example I*

| | | |
|---|---|---|
| Aluminum octoate | grams | 5 |
| Trichlorotrifluoroethane | pints | 1 |
| Dimethyl polysiloxane (viscosity 2.0 centistokes) | do | 1 |

*Example II*

| | | |
|---|---|---|
| Aluminum octoate | grams | 5 |
| n-Hexane or n-heptane | pints | 1 |
| Mineral oil (viscosity 50 to 60 seconds Saybolt at 100° C.) | do | 1 |

Once the electrostatic image has been developed with a catalytic powder, the image bearing plate is then heated as depicted in FIG. 5 to at least partially cure the coating 13 covered by catalytic powder. Then, coating material which was not covered by the catalytic powder is removed from the plate. This is easily accomplished, as depicted in FIG. 6, by spraying the coated plate with a solvent which will remove uncured coating but which will not dissolve the cured or partially cured coating. Where the coating in image areas has been cured to an appreciable degree, toluene or xylene may be sprayed on to remove the coating from non-image areas. If no curing or insufficient curing has taken place, a preferred solvent comprises about equal parts of ethyl or methyl alcohol and trichlorotrifluoroethane. Other suitable solvents include Amso Solvent G (one of a series of petroleum products of high aromatic content marketed by the American Mineral Spirits Co., 155 E. 44th St., New York 17, N.Y.), Solvesso 100 or 150 (two of a series of hydrogenated naphthas, Standard Oil Co. of New Jersey, 30 Rockefeller Plaza, New York 20, N.Y.), methyl chloroform, ethylene dichloride, methylene chloride, or Stoddard solvent. The solvents of this group are particularly effective when used in combination with trichlorotrifluoroethane and/or ethyl or methyl alcohol.

Unless care has been taken during the heating step (FIG. 5) to complete the curing of the silicone binder in the cotaing 13, it is preferred that the plate be again heated after removing the coating 13 from the non-image areas on the plate. Such heating will insure the completion of the cross-linking of the molecular chains in the silicone resin to optimize the insolubility thereof.

Once the desired portions of the photoconductive coating are removed and the remainder thereof insolubilized, the plate is etched to a desired depth to produce the result depicted in FIG. 7. The etched plate 11 has raised (unetched) image portions thereon which were protected from the etch solution by a resist comprising the cured coating material 13'. Etching of the plate may be accomplished by any of the procedures and with any of the solutions commonly employed in the printing plate and etched circuit arts.

What is claimed is:

1. A developer composition for electrostatic deposition consisting essentially of a powdered resin-curing catalyst dispersed in an insulating carrier liquid selected from the class consisting of a mixture of trichlorotrifluoroethane and dimethyl polysiloxane and a mixture of low-viscosity mineral oil and a straight chain hydrocarbon having 5 to 8 carbon atoms, and wherein said powdered catalyst is selected from the class consisting of linoleates, naphthenates, octoates, resinates, stearates, and tallates of aluminum, cadmium, cobalt, copper, iron, lead, magnesium, manganese and zinc.

2. The composition of claim 1 wherein said powdered catalyst is aluminum octoate.

3. The composition of claim 1 wherein said powdered catalyst is aluminum stearate.

4. The composition of claim 1 wherein said powdered catalyst is a mixture of aluminum octoate and aluminum stearate.

5. The composition of claim 1 wherein said liquid is trichlorotrifluoroethane and a dimethyl polysiloxane having a viscosity of from about 0.6 to about 3.0 centistokes.

6. The composition of claim 1 wherein said liquid is a low viscosity mineral oil and a hydrocarbon selected from the class consisting of n-heptane.

7. A composition for electrostatic deposition consisting essentially of finely-divided aluminum octoate dispersed in a carrier liquid comprising about equal parts by volume of trichlorotrifluoroethane and a dimethyl polysiloxane having a viscosity of from about 0.6 to about 3.0 centistokes.

8. A composition for electrostatic deposition consisting essentially of finely-divided aluminum octoate dispersed in a carrier liquid consisting essentially of a low viscosity mineral oil and a hydrocarbon selected from the class consisting of n-hexane and n-heptane in substantially equal proportions by volume.

9. A composition for electrostatic deposition consisting essentially of finely-divided aluminum stearate dispersed in a carrier liquid consisting essentially of about equal parts by volume of trichlorotrifluoroethane and a dimethyl polysiloxane having a viscosity of from about 0.6 to about 3.0 centistokes.

10. A combination for electrostatic deposition consisting essentially of a mixture of finely-divided aluminum octoate and aluminum stearate dispersed in a carrier liquid consisting essentially of about equal parts by volume of trichlorotrifluoroethane and a dimethyl polysiloxane having a viscosity of from about 0.6 to about 3.0 centistokes.

References Cited by the Examiner

UNITED STATES PATENTS

| | | | |
|---|---|---|---|
| 2,579,332 | 12/1951 | Nelson | 260—46.5 |
| 2,584,041 | 1/1952 | Nowak et al. | 106—310 |
| 2,613,162 | 10/1952 | Chatfield | 106—310 |
| 2,735,785 | 2/1956 | Greig | 117—22 |
| 2,907,674 | 10/1959 | Metcalfe et al. | 252—62.1 |
| 2,989,493 | 6/1961 | Clark et al. | 106—27 |
| 3,082,181 | 3/1963 | Brown et al. | 260—185 |
| 3,105,821 | 10/1963 | Johnson | 252—62.1 |

FOREIGN PATENTS

| | | |
|---|---|---|
| 1,089,631 | 9/1960 | Germany. |

OTHER REFERENCES

Payne: Organic Coating, Technology, vol. I, Wiley & Sons, New York, pp. 227–240 and 562–598.

Organic Protective Coatings, Von Fischer et al., Reinhold Publishing Co. (1953), page 361.

SAMUEL H. BLECH, *Primary Examiner.*

JOSEPH R. LIEBERMAN, JULIUS GREENWALD, *Examiners.*

S. R. BRESCH, K. VERNON, J. D. WELSH, *Assistant Examiners.*

UNITED STATES PATENT OFFICE
CERTIFICATE OF CORRECTION

Patent No. 3,291,738 December 13, 1966

Louis J. Sciambi

It is hereby certified that error appears in the above numbered patent requiring correction and that the said Letters Patent should read as corrected below.

Column 5, line 46, after "n-heptane" insert -- and n-hexane --.

Signed and sealed this 28th day of November 1967.

(SEAL)
Attest:

Edward M. Fletcher, Jr.
Attesting Officer

EDWARD J. BRENNER
Commissioner of Patents